United States Patent [19]

Cairns et al.

[11] Patent Number: 4,528,212
[45] Date of Patent: Jul. 9, 1985

[54] COATED CERAMIC SUBSTRATES FOR MOUNTING INTEGRATED CIRCUITS

[75] Inventors: James A. Cairns, Wantage, United Kingdom; James F. Ziegler, Yorktown Heights, N.Y.

[73] Assignees: International Business Machines Corporation, New York, N.Y.; United Kingdom Atomic Energy Authority, England

[21] Appl. No.: 400,813

[22] Filed: Jul. 22, 1982

[51] Int. Cl.³ .............................................. A23L 1/216
[52] U.S. Cl. ................... 427/96; 427/376.2; 427/376.1; 427/5; 428/432; 428/446; 428/428; 428/701; 428/472
[58] Field of Search .............. 428/432, 446, 701, 428, 428/472; 427/376.1, 376.2, 96, 5

[56] References Cited

U.S. PATENT DOCUMENTS 4,230,773 10/1980 Bakos ..................................... 427/96
4,297,246 10/1981 Cairns et al. .......................... 148/38

OTHER PUBLICATIONS

IBM Technical Disclosure Bulletin, vol. 22, No. 2, p. 678, (Jul. 1979).

Primary Examiner—George F. Lesmes
Assistant Examiner—E. Rollins Buffalow
Attorney, Agent, or Firm—Scully, Scott Murphy & Presser

[57] ABSTRACT

Coated ceramic substrates or structures having a barrier layer against alpha-particle radiation and integrated circuits prepared therefrom. Ceramic surfaces having reduced or modified surface roughness are also provided.

8 Claims, 2 Drawing Figures

BACK-SIDE BONDED ELECTRONIC MODULE

FLIP-CHIP BONDED ELECTRONIC MODULE

BACK-SIDE BONDED ELECTRONIC MODULE

COATED CERAMIC SUBSTRATES FOR MOUNTING INTEGRATED CIRCUITS

BACKGROUND OF THE INVENTION

This invention relates to coated ceramic objects and more particularly to coated ceramic substrates useful for mounting integrated circuit chips.

Ceramics are widely used as substrates and containers for integrated circuit modules. While the utilization of ceramic substrates offers many advantages in the manufacture of integrated circuits, problems do exist. For example, a recent relatively serious problem is referred to as the soft error rate (SER) of the integrated circuit. While minimum SER levels are tolerated, excessive levels are unacceptable.

There are two general ways in which integrated circuit chips are mounted upon or in a carrying structure, i.e., substrate. That is, the integrated circuit chip can be faced down toward the carrying substrate or can be faced away from the carrying substrate but, perhaps, towards other ceramic materials. The first technique involving contacts down is known in the art as face down or flip chip bonding. The second is generally called in the art backside bonding. The present invention is primarily described in terms of face down or flip chip bonding, but may be equally applicable to backside bonded chips.

In face down or flip chip bonding, the SER problem stems, in part, from alpha-particles being emitted from atomic radioactive impurities in the composition of the ceramic substrate, upon which the integrated circuit chips are mounted. These alpha-particles cross over the narrow gap between the substrate and the chip and collide with the chip causing an electronic noise burst. This electronic noise burst may be detected by part of the integrated circuit chip and may be mistaken for a logic signal, thereby leading to an error, which is called a "soft-fail". Further, similar errors may occur in electronic memories where radiation may flip information bits, e.g. a zero may be changed to a one.

One prior art procedure, which has been followed in an attempt to reduce soft error rates, involves squirting, under high pressure, a polymer believed to be a silicon containing polymer, between the already mounted chip and the nearby ceramic surfaces and then curing the inserted polymer. The resulting cured polymer layer is adequate to absorb the alpha-particles emitted by the ceramic, thus preventing them from reaching the integrated circuit. While this prior art procedure has been relatively successful in reducing soft error rates, it is an expensive operation.

Another problem associated with the utilization of ceramic substrates for mounting integrated circuits relates to the porosity and surface roughness of the ceramic carrying structure. It is known that the results obtained by depositing metal on the ceramic substrate is greatly influenced by the roughness of the ceramic surface. For example, excessive pitting on the ceramic surface results in gaps between metal line circuitry and the ceramic base, as well as, metal lines which break when they dip into the pitholes. Results of this kind will generally cause circuitry failures and thus samples exhibiting excessive flaws of this nature are usually discarded. Although ceramics with increased surface smoothness are commercially available, they are generally relatively expensive and thus may not present a commercially acceptable solution to the problem.

A method for reducing the porosity and surface roughness of ceramic substrates is disclosed in U.S. Pat. No. 4,230,773. This patent discloses a process wherein the application of sequential layers of coating reduces the surface roughness of a ceramic in a gradual manner. The manner generally includes applying a liquid coating containing at least one nonpolymeric silicon compound, such as a liquid organosilicon, and/or ethylenically unsaturated organosilicon compound, to at least one surface of the ceramic substrate. The coated substrate is then dried and subjected to elevated temperatures in order to convert the silicon compound to silicon oxides, which provides a smooth surface to the ceramic.

Thus, while the method of U.S. Pat. No. 4,230,773 may provide one solution to the surface roughness of the ceramic substrate, it still does not consider the SER problems experienced with ceramic substrates, as discussed herein before.

SUMMARY OF THE INVENTION

Accordingly, it is one object of the present invention to provide improved ceramic surfaces for mounting or containing integrated circuits.

Another object of the present invention is to provide a ceramic substrate or surface, useful for mounting or containing integrated circuit chips, which obviates the problem of alpha-particles coming into contact with a thereon mounted integrated circuit chip.

A further object of this invention is to provide a ceramic substrate, useful for mounting integrated circuits, having increased surface smoothness and controlled surface texture.

A still further object of the present invention is to provide an integrated circuit comprising a ceramic substrate or enclosure which exhibits reduced soft error rates.

These and other objects are accomplished herein by providing a ceramic substrate or container, having coated on at least a portion of at least one surface thereof a layer of a substance free from alpha particle emission. Integrated circuit modules comprised of said coated ceramic substrate or container having at least one integrated circuit chip mounted thereon or within and methods for the production thereof are also described herein.

Moreover, methods for providing modified ceramic surfaces having controlled surface texture are also provided herein, said methods involving coating a ceramic surface with a layer of a substance which may or may not emit alpha-particles.

DETAILED DESCRIPTION OF THE INVENTION

Figure 1:
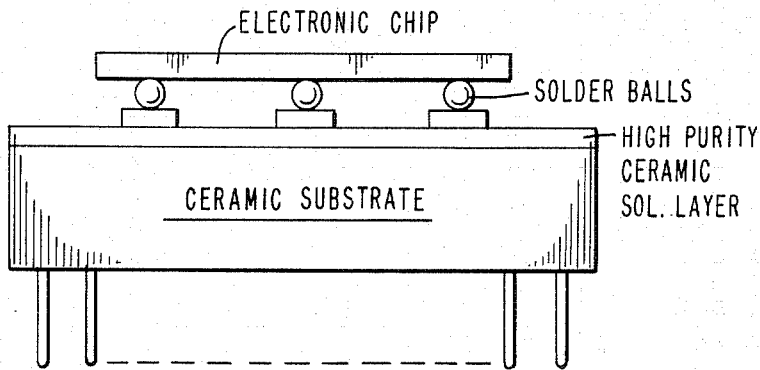
FIG. 1 is an elevational view of an integrated circuit module, prepared in accordance with the present invention, illustrating a ceramic substrate having a layer of an alpha-particle emitting free coating thereon between the ceramic base and the face down integrated circuit chip.

The substrates, which hereinafter will also imply ceramic walls or lids facing the electronic chip, which are modified and improved in accordance with the present invention, are ceramic substrates. For the purposes of the present invention, a ceramic may be defined as an insulating solid, such as a solid oxide or a solid mixture of oxides, which is resistant to volatilization at high temperature, e.g. up to 1000° C. Ceramics may be comprised of oxides such as alumina and silica.

A typical ceramic substrate, which is modified in accordance with the present invention, comprises, for example, 96% alumina and 4% silica. Moreover, the ceramics, which benefit from the teachings of this invention, are those ceramics which emit alpha-particles, usually due to impurities contained therein. Levels of alpha-particle emission from such ceramic substrates can include, for example, up to 300 $\alpha/cm^2/$ hour.

In accordance with the present invention, a layer of a material, which is compatible with the surface of the ceramic substrate, is applied to at least a portion of at least one surface of the substrate. In addition to compatibility and in order to achieve the objects of the present invention, the coating which is applied to the ceramic substrate, must be one which is capable of absorbing alpha-particle radiation and also must, itself, be free from alpha-particle emission. By free from alpha-particle emission, it is meant herein that the coating material emits none or preferably no more than 0.003 $\alpha/cm^2/$hour.

Specifically, substances which are suitable for coatings in accordance with the present objective, include refractory materials, including refractory oxides, such as alumina, ceria, silica, zirconia, titania and the like. To avoid any alpha-particle radiation, these coating materials are generally of a relatively high purity. For example, high purity alumina (less than $10^{-9}$ uranium content) is a preferred coating material herein.

Generally, the coatings of the present invention may be applied to the ceramic substrate by any conventional procedure. Typically, such procedures include, dipping (immersing), spraying, vapor deposition, sputtering, spin coating, flow coating, screen printing, electrophoresis and the like.

One method for accomplishing the objects of this invention is to apply to the ceramic substrate a coating consisting of a colloidal dispersion of particulates. Such a dispersion, referred to as a sol, may contain colloidal (i.e. typically 0.001–1 $\mu$m dia.) particles, which on drying and subsequent firing become converted to a protective oxide layer. The colloidal particles may be substantially unaggregated in the liquid phase, with the result that on being transferred to the surface of the ceramic substrate they densify efficiently on subsequent firing to produce a dense protective ceramic layer, as described in U.S. Pat. No. 4,297,246, incorporated by reference herein. Alternatively, a proportion of aggregated colloidal particles may be included in the dispersion to produce a more resilient coating, which is less liable to exhibit crazing on subsequent firing. The liquid medium may be aqueous, (in which case the addition of a small proportion of a surfactant is recommended) or it may consist of an organic liquid.

In order to improve the probability of achieving, in one operation, a final coating of the desired thickness (10–50 $\mu$m), it may be desirable to use particulates of larger dimensions (for example in the range of 0.05–5 $\mu$m). Such particles will usually be oxides, such as silica, alumina, titania, etc., as single or mixed oxides.

Control of the size of the particulate material has the added advantage of offering a method by which the final surface texture of the applied coating may be controlled. Particulate sizes for these purposes herein include particles sizes in the range of from 0.05 $\mu$m to about 5 $\mu$m.

In a further variation, the liquid medium may consist of a silica precursor, in which is dispersed the particulate material. This liquid may be organic in nature, such as quaternary ammonium silicate, sold under the trade name Quram (Emery Industries, Inc.) or a silicone glycol copolymer, such as the surfactant Dow Corning 193, sold by the Dow Corning Corporation.

Coating the ceramic substrate, in accordance with the invention herein, may be carried out very simply, for example, by immersing the substrate in the sol or other coating medium, and evaporating or otherwise removing the liquid medium from the layer of sol on the substrate. The coated substrate is then fired, i.e. exposed to elevated temperatures, usually temperatures in the range of from about 800° C. to about 1200° C. The time required for firing is generally from about 0.25 hours to about 1 hour. The firing treatment, which results in a stable union or bond of the coating material with the ceramic substrate surface, can be carried out under ambient or normal atmospheric conditions, such as in the presence of air or in an inert atmosphere.

The coating compositions can also include other ingredients for example, stabilizing agents, anti-foam agents and the like.

Moreover, it is to be understood that in accordance with the present invention, the entire ceramic substrate, i.e. all the surfaces, may be coated or simply one complete surface may be coated, e.g. the surface upon which one or more integrated circuit chips is mounted. Even more simply, just a portion or portions of one surface may be coated, e.g. merely the portion or portions of the surface above which the integrated circuit chip or chips is mounted.

Ceramic substrates, modified in accordance with the above-described process of the present invention, prevent alpha-particle radiation from reaching an integrated circuit chip mounted thereon and also have reduced porosity and roughness. Thus, the coating composition absorbs alpha-particles emitted from the ceramic substrate and at the same time fills in pitholes and other surface imperfections.

In the preparation of a typical integrated circuit module within the scope of the present invention, after the ceramic substrate has been coated as described hereinbefore, the coated ceramic surface is metallized by conventional procedures. Typically, the metallization procedure involves vacuum evaporating or vacuum sputtering metals, such as chromium/copper, to form metal circuitry lines on the ceramic substrate. The metallized substrate is then dipped in a solder bath. The deposited solder is then heated to form a ball of solder. The integrated chip is thereafter placed face down on the substrate with the solder balls. The chip is joined by passing the composite into a furnace whereby the solder contacts and the connecting areas are heated to a temperature and for a time sufficient to melt the solder from the connecting area to form a unified solder mass at this temperature. The resulting product is illustrated in FIG. 1.

Figure 2:
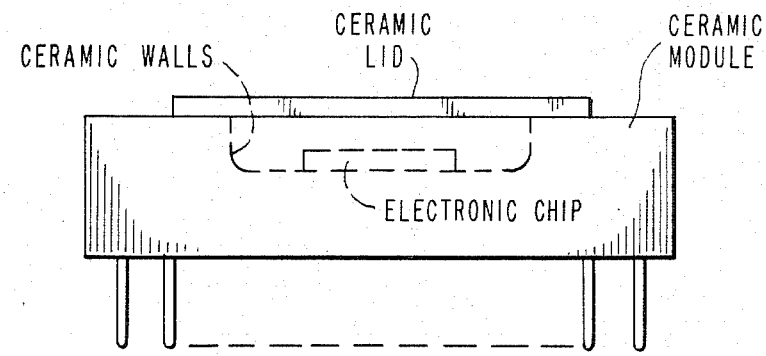
FIG. 2 is also an elevational view of an integrated circuit module wherein the electronic chip is backside bonded and wherein the ceramic walls and/or lid are coated with a layer of alpha-particle emitting free substance.

The equivalent structure for backside bonded electronic chips is shown in FIG. 2. Here, the chip is subjected to alpha-particles from the ceramic walls and/or lid which may also be coated in accordance with the present invention to eliminate the radiation.

In order that those skilled in the art may better understand how the present invention may be practiced, the following examples are given by way of illustration and not by way of limitation.

EXAMPLE 1

Particulate alumina (particle size 1–3 μm; 10 g) is mixed with a colloidal dispersion of alumina, (100 g), prepared by using a suitable organic presursor, such as aluminum secondary butoxide. This is applied in droplet form to a ceramic substrate, which is spun to achieve a uniform coating and then dried, e.g. at 120° C. The coated substrate is then fired (baked) in air at 1200° C. for 15 minutes to produce an adherent coating of controlled surface roughness.

EXAMPLE 2

Dow Corning surfactant DC 193 (300 g) is mixed with a colloidal dispersion of high purity boehmite alumina (200 g). The resultant dispersion is applied in droplet form to a ceramic substrate, which is spun to achieve a uniform coating, and then dried. The coated substrate is dried, e.g. at 120° C., then fired (baked) in air at 850° C. for 15 minutes to produce an adherent coating, which is even smoother (<1 μm surface roughness) than that described in Example 1, due to the use of smaller particulate alumina.

Obviously other modifications and variations of the present invention are possible in the light of the above teachings. It is, therefore, to be understood that changes may be made in the particular embodiments of this invention which are within the full intended scope of the invention as defined by the appended claims.

We claim:

1. A method of modifying and controlling the surface texture of a ceramic surface on an integrated circuit chip carrier, said method comprising the steps of:
    coating the ceramic surface of an integrated circuit chip carrier to be modified with a ceramic precursor liquid dispersion of particulates wherein the particulates have a particle size in the range of from about 0.05 to about 5 μm, the surface texture of the modified surface being controlled by providing that the particle size of the particulates is within said range of from about 0.05 to about 5 μm;
    removing said liquid from said dispersion of particulates on said ceramic surface;
    firing said coating to obtain a stable union or bond of said coating with said ceramic surface.
2. The method of claim 1 wherein the liquid dispersion is a sol.
3. The method of claim 1 wherein the particulates are aggregated colloidal particles.
4. The method of claim 1 wherein the particulates are substantially unaggregated colloidal particles.
5. The method of claim 1 wherein the coating is substantially free of alpha-particle emitting substances.
6. The method of claim 1 wherein the ceramic precursor liquid dispersion is sol of a refractory oxide.
7. The method of claim 6 wherein said refractory oxide is selected from the group consisting of alumina, ceria, silica, zirconia, titania and mixtures thereof.
8. The method of claim 7 wherein said refractory oxide is alumina.

* * * * *